(12) United States Patent
Kikuchi et al.

(10) Patent No.: US 8,895,322 B2
(45) Date of Patent: Nov. 25, 2014

(54) METHOD FOR MAKING SEMICONDUCTOR DEVICE HAVING FERROELECTRIC CAPACITOR THEREIN

(75) Inventors: Hideaki Kikuchi, Kawasaki (JP); Kouichi Nagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/271,527

(22) Filed: Oct. 12, 2011

(65) Prior Publication Data

US 2012/0028374 A1 Feb. 2, 2012

Related U.S. Application Data

(60) Division of application No. 12/796,955, filed on Jun. 9, 2010, now abandoned, which is a division of application No. 11/849,715, filed on Sep. 4, 2007, now abandoned, which is a continuation of application No. PCT/JP2005/003382, filed on Mar. 1, 2005.

(51) Int. Cl.
| | |
|---|---|
| *H01L 21/00* | (2006.01) |
| *H01L 21/8242* | (2006.01) |
| *H01L 21/31* | (2006.01) |
| *H01L 27/115* | (2006.01) |
| *H01L 21/768* | (2006.01) |
| *H01L 49/02* | (2006.01) |

(52) U.S. Cl.
CPC .......... *H01L 27/11507* (2013.01); *H01L 28/65* (2013.01); *H01L 21/76834* (2013.01); *H01L 28/57* (2013.01); *H01L 27/11502* (2013.01)
USPC ......... 438/3; 438/253; 438/790; 257/E21.009

(58) Field of Classification Search
CPC ................. H01L 21/76834; H01L 21/76832; H01L 21/02164; H01L 21/02274; H01L 21/76829; H01L 21/02332; H01L 21/31616
USPC ....................... 438/3, 253, 790; 257/E21.009
See application file for complete search history.

(56) References Cited

U.S. PATENT DOCUMENTS

| | | | |
|---|---|---|---|
| 5,385,868 A | 1/1995 | Chao et al. | |
| 5,482,893 A * | 1/1996 | Okabe et al. ................... | 438/618 |

(Continued)

FOREIGN PATENT DOCUMENTS

| | | |
|---|---|---|
| JP | 60-262443 A | 12/1985 |
| JP | 63-117429 A | 5/1988 |

(Continued)

OTHER PUBLICATIONS

International Search Report of PCT/JP2005/003382, Mailing Date of May 10, 2005.

(Continued)

*Primary Examiner* — Shouxiang Hu
(74) *Attorney, Agent, or Firm* — Westerman, Hattori, Daniels & Adrian, LLP

(57) ABSTRACT

A ferroelectric capacitor provided with a ferroelectric film (10a) is formed above a semiconductor substrate, and thereafter a wiring (17) directly connected to electrodes (9a, 11a) of a ferroelectric capacitor is formed. Then, a silicon oxide film (18) covering the wiring (17) is formed. As the silicon oxide film (18), a film which has processability higher than that of an aluminum oxide film is formed. Besides, a degree of damage that occurs in the ferroelectric capacitor when the insulating film is formed is equal to or less than that when an aluminum oxide film is formed.

4 Claims, 9 Drawing Sheets

(56) References Cited

U.S. PATENT DOCUMENTS

| | | |
|---|---|---|
| 6,469,391 B2 | 10/2002 | Matsubara |
| 6,501,112 B1 | 12/2002 | Sashida |
| 6,627,462 B1 | 9/2003 | Yang et al. |
| 6,635,529 B2 | 10/2003 | Inomata |
| 6,717,198 B2 | 4/2004 | Yoshikawa et al. |
| 6,750,108 B2 * | 6/2004 | Ueda .................. 438/303 |
| 6,794,199 B2 | 9/2004 | Yoshikawa et al. |
| 6,972,449 B2 | 12/2005 | Yoshikawa et al. |
| 7,288,799 B2 * | 10/2007 | Saigoh et al. ............ 257/127 |
| 2001/0028074 A1 | 10/2001 | Kutsunai et al. |
| 2002/0056861 A1 | 5/2002 | Nagano et al. |
| 2002/0149082 A1 | 10/2002 | Nagano et al. |
| 2003/0003639 A1 * | 1/2003 | Kanda et al. ............ 438/197 |
| 2003/0058709 A1 | 3/2003 | Yoshikawa et al. |
| 2003/0071293 A1 | 4/2003 | Otani et al. |
| 2003/0132472 A1 | 7/2003 | Koizumi |
| 2004/0084701 A1 | 5/2004 | Kanaya et al. |
| 2004/0140493 A1 | 7/2004 | Yoshikawa et al. |
| 2005/0036375 A1 | 2/2005 | Yoshikawa et al. |
| 2005/0098812 A1 | 5/2005 | Yang et al. |
| 2005/0181559 A1 * | 8/2005 | Natori et al. ............ 438/253 |

FOREIGN PATENT DOCUMENTS

| | | |
|---|---|---|
| JP | 08-264719 A | 10/1996 |
| JP | 10-256254 A | 9/1998 |
| JP | 11-074486 A | 3/1999 |
| JP | 2000-004001 A | 1/2000 |
| JP | 2002-026286 A | 1/2002 |
| JP | 2002-176149 A | 6/2002 |
| JP | 2002-280528 A | 9/2002 |
| JP | 2003-100994 A | 4/2003 |
| JP | 2003-197878 A | 7/2003 |
| JP | 2003-209223 A | 7/2003 |
| JP | 2004-158880 A | 6/2004 |

OTHER PUBLICATIONS

Notification of Transmittal of Translation of the International Preliminary Report on Patentability (Form PCT/IB/338) of International Application No. PCT/JP2005/003382 mailed Sep. 20, 2007 with Forms PCT/IB/373 and PCT/ISA/237.

* cited by examiner

METHOD FOR MAKING SEMICONDUCTOR DEVICE HAVING FERROELECTRIC CAPACITOR THEREIN

INCORPORATED-BY-REFERENCE TO RELATED APPLICATIONS

This application is a divisional application of U.S. Ser. No. 12/796,955 filed Jun. 9, 2010, which is a divisional application of U.S. Ser. No. 11/849,715 filed Sep. 4, 2007, which is a continuation of PCT/JP2005/003382 filed Mar. 1, 2005, the entire contents of which being incorporated herein by reference.

TECHNICAL FIELD

The present embodiment relates to a semiconductor device suitable for a nonvolatile memory equipped with a ferroelectric capacitor and a method for manufacturing the same.

BACKGROUND ART

In recent years, use of a ferroelectric film serving as a dielectric film for a capacitor has received much attention. Such a capacitor is called a ferroelectric capacitor, and a ferroelectric memory (FeRAM: Ferro-Electric Random Access Memory) equipped with the ferroelectric capacitor is a nonvolatile memory. The ferroelectric memory has various merits such as the capability of high speed operation, low power consumption, and is excellent in write/read resistance. Further developments are expected in the future.

The ferroelectric capacitor, however, has a disadvantage in that its efficiency deteriorates easily due to hydrogen gas and moisture penetration from the outside. For example, in a ferroelectric capacitor which is composed of a bottom electrode made of a platinum (Pt) film, a ferroelectric film composed of a $PbZr_{1-x}Ti_xO_3$ film (PZT film), and a top electrode made of a platinum (Pt) film being stuck in order, it has been known that when a substrate is heated at about 200° C. in the atmosphere of about 40 Pa (0.3 Torr) of a hydrogen partial pressure, the ferroelectric characteristics of the PZT film are almost lost. It is also known that, when a thermal treatment is conducted in a state that the ferroelectric capacitor absorbs moisture or in a state that moisture exists in the vicinity of the capacitor, the ferroelectricity of the ferroelectric film of the ferroelectric capacitor is remarkably reduced.

Owing to such characteristics of the existence of this property in the ferroelectric capacitor, during the manufacturing process of the ferroelectric memory, a process which incurs least moisture generation and is able to perform at temperatures as low as possible is selected as the process after formation of a ferroelectric film. In addition, as a process to deposit an interlayer insulating film, for example, a deposition process by a CVD (Chemical Vapor Deposition) method or the like using a raw material gas that generates hydrogen in a relatively small amount is selected. Furthermore, as a technology to prevent deterioration of the ferroelectric film caused by hydrogen and moisture, a technology to form an aluminum oxide film so as to cover the ferroelectric capacitor, a technology to form an aluminum oxide film on an interlayer insulating film formed on the ferroelectric capacitor, and so on have been proposed. This is because the aluminum oxide film has an ability to prevent diffusion of hydrogen and moisture. Therefore, according to these technologies, it becomes possible to prevent deterioration of the ferroelectric film caused by hydrogen and moisture by preventing hydrogen and moisture from arriving at the ferroelectric film.

These technologies are described, for example, in Patent Documents 1 to 5.

In addition, after forming the ferroelectric capacitor, aluminum (Al) wiring is formed and an oxide film is further formed as an interlayer insulating film by a plasma CVD method or the like. Even during the formation of the oxide film, deterioration of the ferroelectric capacitor sometimes occurs. Therefore, an aluminum oxide film covering the aluminum (Al) wiring is formed before formation of the oxide film.

It is difficult, however, to etch the aluminum oxide film. In order to ensure conduction of electricity between the upper layer wiring and the aluminum (Al) wiring, formation of a via hole by etching the aluminum oxide film is required, but this processing is difficult. Accordingly, the diameter of a via hole may become smaller than the designed value or a state of a tungsten plug to be formed as a via plug becomes unusual due to the influence of an etching deposition product, which sometimes causes a contact failure. As a result, a design margin becomes narrow, stable characteristics are difficult to be obtained, which lead to lowering of yield.

Patent Document 1: Japanese Patent Application Laid-open No. 2003-197878
Patent Document 2: Japanese Patent Application Laid-open No. 2001-68639
Patent Document 3: Japanese Patent Application Laid-open No. 2003-174145
Patent Document 4: Japanese Patent Application Laid-open No. 2002-176149
Patent Document 5: Japanese Patent Application Laid-open No. 2003-100994
Patent Document 6: Japanese Patent Application Laid-open No. Sho 60-262443
Patent Document 7: Japanese Patent Application Laid-open No. Sho 63-117429
Patent Document 8: Japanese Patent Application Laid-open No. Hei 10-256254

SUMMARY OF THE INVENTION

It is an aspect of the embodiments discussed herein to provide a semiconductor substrate; a ferroelectric capacitor formed above the semiconductor substrate, and provided with a ferroelectric film; a wiring directly connected to an electrode of the ferroelectric capacitor; and an insulating film covering the wiring. A degree of damage which occurs in the ferroelectric capacitor when the insulating film is formed is equal to or less than that when an aluminum oxide film is formed, and the insulating film has processability higher than that of an aluminum oxide film.

It is an aspect of the embodiments discussed herein to provide a ferroelectric capacitor provided with a ferroelectric film is formed above a semiconductor substrate, and thereafter a wiring directly connected to an electrode of the ferroelectric capacitor is formed. Then, an insulating film covering the wiring is formed. As the insulating film, a film having processability higher than that of an aluminum oxide film is formed. Furthermore, a degree of damage which occurs in the ferroelectric capacitor when the insulating film is formed is equal to or less than that when an aluminum oxide film is formed.

DETAILED DESCRIPTION OF THE PREFERRED EMBODIMENTS

Figure 1:
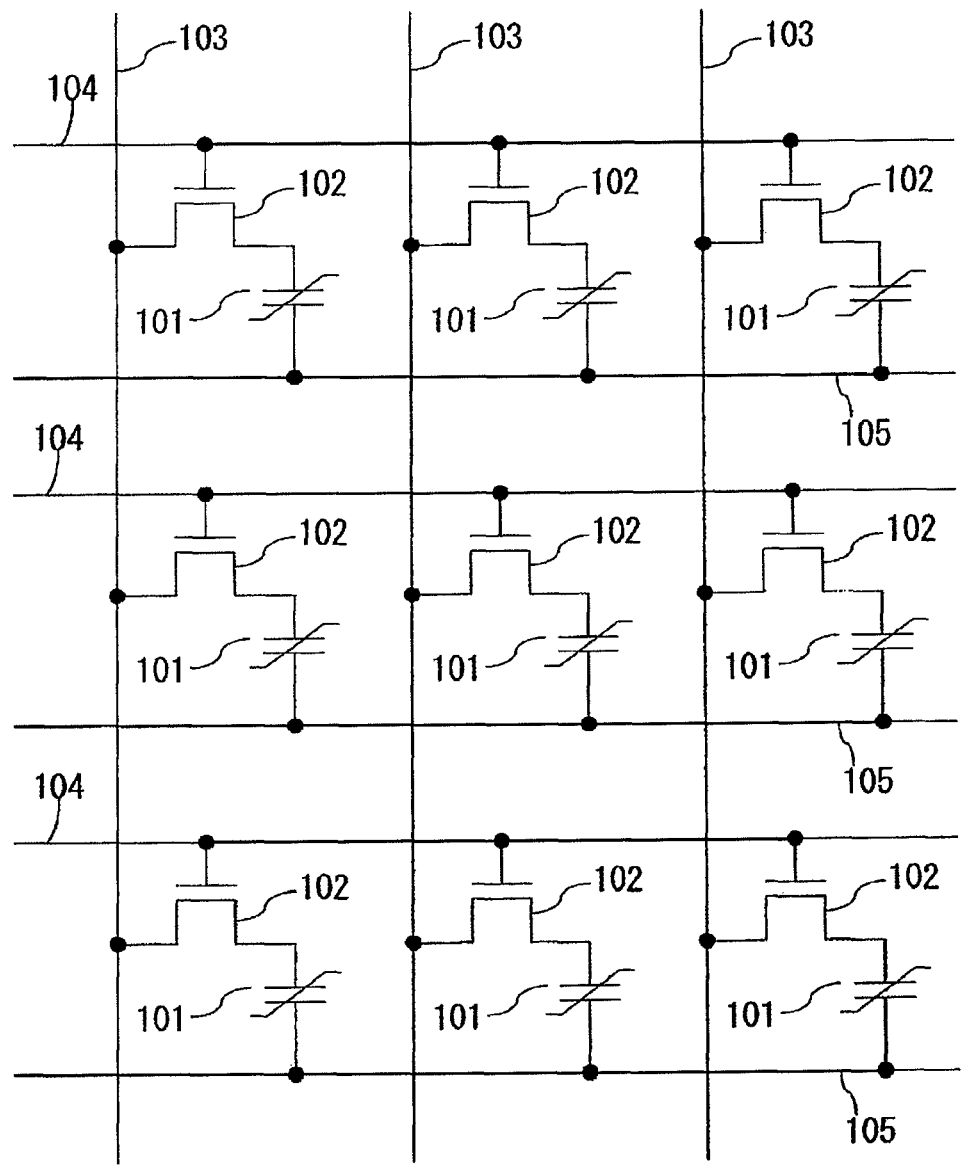
FIG. 1 is a circuit diagram showing a configuration of a memory cell array of a ferroelectric memory (semiconductor device) to be manufactured by a method according to an embodiment.

Embodiments will be explained in detail with reference to attached drawings hereinafter. FIG. 1 is a circuit diagram showing a configuration of a memory cell array of a ferroelectric memory (semiconductor device) to be manufactured by a method according to an embodiment.

The memory cell array includes a plurality of bit lines 103 extending in one direction, a plurality of word lines 104 and plate lines 105 extending in the direction perpendicular to the direction in which the bit lines 103 extend. A plurality of memory cells of the ferroelectric memory according to the present embodiment is arranged in an array so as to match with lattices composing these bit lines 103, the word lines 104, and the plate lines 105. The respective memory cells are provided with ferroelectric capacitors (memory unit) 101 and MOS transistors (switching unit) 102.

A gate of the MOS transistor 102 is connected to the word line 104. One source/drain of the MOS transistor 102 is connected to the bit line 103, and the other source/drain is connected to one electrode of the ferroelectric capacitor 101. The other electrode of the ferroelectric capacitor 101 is connected to the plate line 105. Note that, the respective word lines 104 and plate lines 105 are owned jointly by a plurality of MOS transistors 102 arranged in the same direction in which these lines extend. Similarly, the respective bit lines 103 are owned jointly by a plurality of MOS transistors 102 arranged in the same direction in which these lines extend. The direction in which the word line 104 and the plate line 105 extend, and the direction in which the bit line 103 extends are called the row direction and the column direction, respectively. It should be noted that the arrangement of the bit lines 103, the word lines 104, and the plate lines 105 is not limited to that described above.

In a memory cell array of the ferroelectric memories thus structured, the data is stored according to the state of polarization of the ferroelectric film provided in the ferroelectric capacitor 101.

An embodiment will be explained next. Here, for convenience' sake, the cross sectional structure of each memory cell of the ferroelectric memory will be explained together with a method for manufacturing the same. FIG. 2A to FIG. 2M are cross sectional views showing a method for manufacturing a ferroelectric memory (semiconductor device) according to the embodiment in order of the manufacturing process.

Figure 2A:
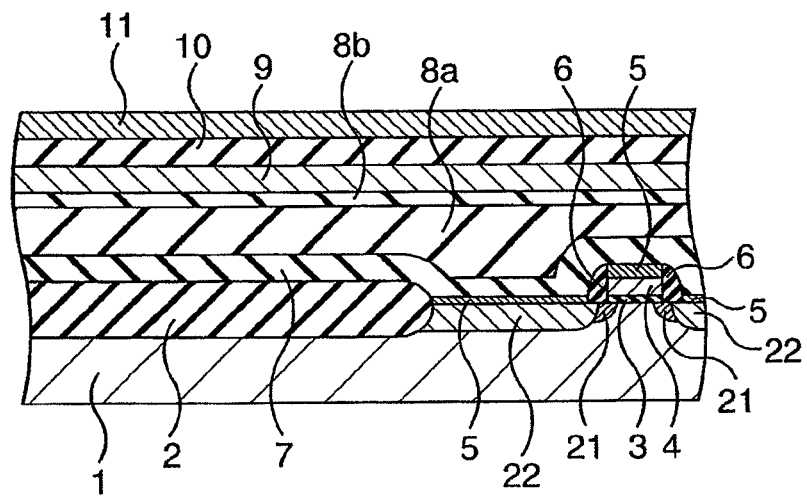
FIG. 2A is a cross sectional view showing the method for manufacturing a ferroelectric memory according to an embodiment.

In the present embodiment, first, as shown in FIG. 2A, an element isolation insulating film 2 that defines an element activating region is formed on the surface of a semiconductor substrate 1 such as a silicon (Si) substrate or the like by, for example, a Local Oxidation of Silicon (LOCOS) method. Next, a transistor (MOSFET) including a gate insulating film 3, a gate electrode 4, a silicide layer 5, a side wall 6, and source/drain diffusion layers composed of a low concentration diffusion layer 21 and a high concentration diffusion layer 22 is formed in the element activating region defined by the element isolation insulating film 2. This transistor corresponds to a MOS transistor 102 in FIG. 1. As the gate insulating film 3, for example, an $SiO_2$ film of about 100 nm in thickness is formed by thermal oxidation. Then, a silicon oxy-nitride film 7 is formed so as to cover the MOSFET, and a silicon oxide film 8a is further formed over the entire surface. The silicon oxy-nitride film 7 is formed to prevent hydrogen degradation of the gate insulating film 3 and the like when the silicon oxide film 8a is formed. For example, a tetraethylorthosilicate (TEOS) film of about 700 nm in thickness is formed as a silicon oxide film 8a by a CVD method.

Thereafter, degassing of the silicon oxide film 8a is conducted by performing an annealing treatment for 30 minutes at 650° C. in a nitrogen gas ($N_2$) atmosphere. Then, an aluminum oxide ($Al_2O_3$) film 8b of about 20 nm in thickness, serving as a bottom electrode adhesion layer, is formed on the silicon oxide film 8a by, for example, a sputtering method. A bottom electrode film 9 is formed on the aluminum oxide ($Al_2O_3$) film 8b. As the bottom electrode film 9A, a platinum (Pt) film which has a thickness of about 150 nm is formed by, for example, a sputtering method.

Next, a ferroelectric film 10 is formed on the bottom electrode film 9 in an amorphous state, as is similarly shown in FIG. 2A. As the ferroelectric film 10, a PLZT film having a thickness of about 100 nm to about 200 nm is formed by an RF sputtering method, using a PLZT ((Pb, La)(Zr, Ti)$O_3$) target, for example. Next, a thermal treatment (RTA: Rapid Thermal Annealing) is conducted at 650° C. or lower in an atmosphere containing argon (Ar) and oxygen ($O_2$), and another RTA is conducted further at 750° C. in an oxygen atmosphere. As a result, the ferroelectric film 10 is completely crystallized, and a platinum (Pt) film composing the bottom electrode film 9 is made denser so that mutual diffusion between platinum (Pt)

and oxygen (O) in the vicinity of the interface between the bottom electrode film 9 and the ferroelectric film 10 is restrained.

Thereafter, as is shown similarly in FIG. 2A, a top electrode film 11 is formed on the ferroelectric film 10. As the top electrode film 11, an iridium oxide film having a thickness of about 200 nm to about 300 nm is formed by, for example, a sputtering method.

Figure 2B:
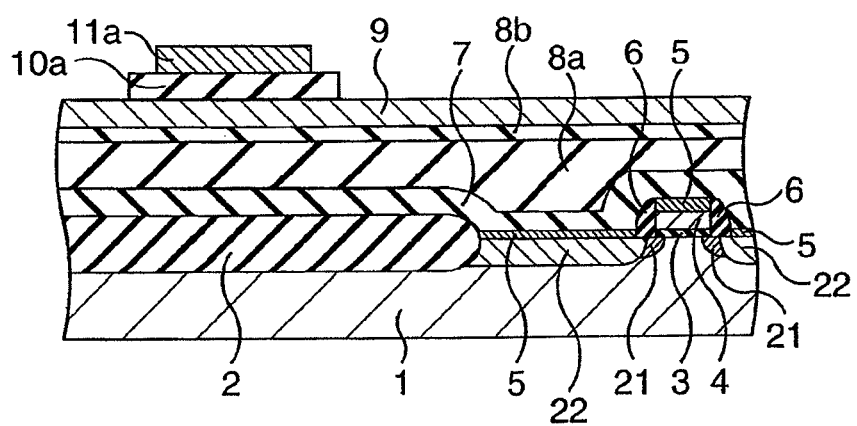
FIG. 2B is a cross sectional view showing the method for manufacturing a ferroelectric memory according to the embodiment, following FIG. 2A.

Then, a top electrode 11a is formed as shown in FIG. 2B by patterning the top electrode film 11. Next, thermal treatment is conducted in an atmosphere containing oxygen to repair damage by patterning and so on. Then, by patterning the ferroelectric film 10, a capacitor insulating film 10a is formed, as is similarly shown in FIG. 2B. Then, oxygen annealing for prevention of peeling of an aluminum oxide ($Al_2O_3$) film to be formed later is undergone.

Figure 2C:
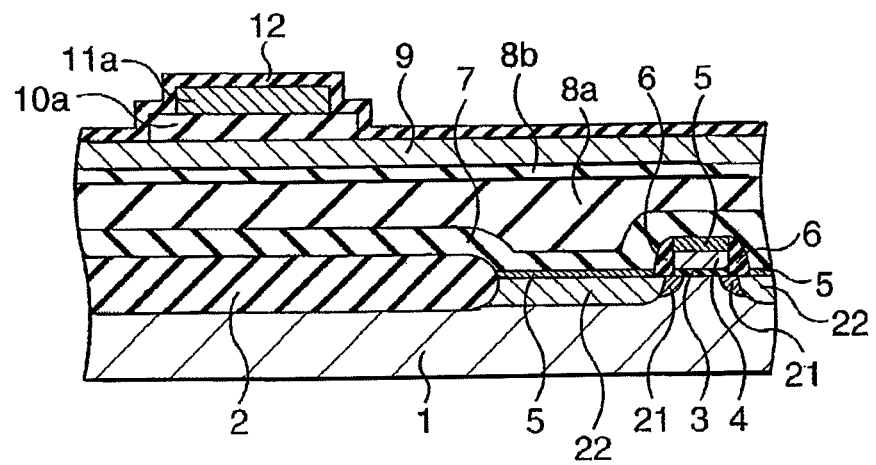
FIG. 2C is a cross sectional view showing the method for manufacturing a ferroelectric memory according to the embodiment, following FIG. 2B

Then, as shown in FIG. 2C, an aluminum oxide ($Al_2O_3$) film 12 serving as a protective film is formed over the entire surface by a sputtering method. Then, oxygen annealing is conducted to repair the damage caused by the sputtering. By the protective film ($Al_2O_3$ film 12), the penetration of hydrogen into the ferroelectric capacitor from outside is prevented.

Figure 2D:
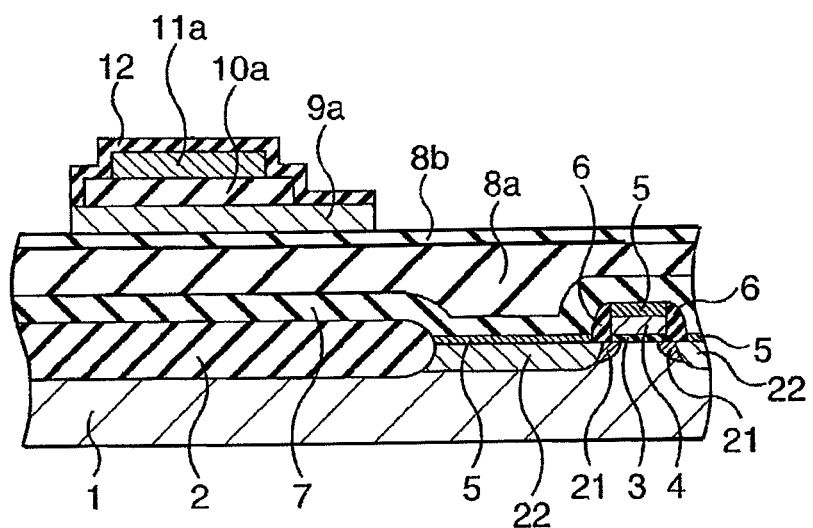
FIG. 2D is a cross sectional view showing the method for manufacturing a ferroelectric memory according to the embodiment, following FIG. 2C.

Then, as shown in FIG. 2D, by patterning the aluminum oxide ($Al_2O_3$) film 12 and the bottom electrode film 9, a bottom electrode 9a is formed. Then, oxygen annealing for prevention of peeling of an aluminum oxide ($Al_2O_3$) film to be formed later is conducted. A ferroelectric capacitor provided with the bottom electrode 9a, the capacitor insulating film 10a and the top electrode 11a corresponds to the ferroelectric capacitor 101 in FIG. 1.

Figure 2E:
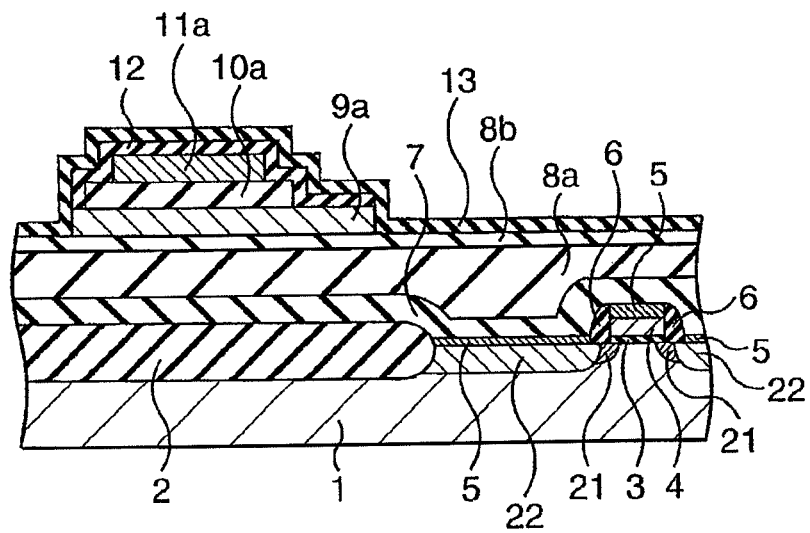
FIG. 2E is a cross sectional view showing the method for manufacturing a ferroelectric memory according to the embodiment, following FIG. 2D.

Then, as shown in FIG. 2E, an aluminum oxide ($Al_2O_3$) film 13 as a protective film is formed over the entire surface by a sputtering method. Thereafter, oxygen annealing is conducted to reduce capacitor leakage.

Figure 2F:
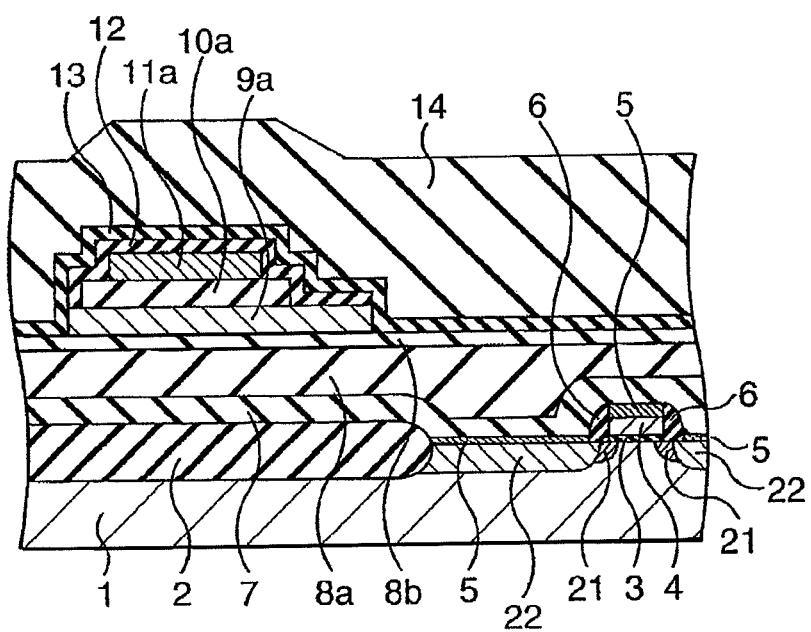
FIG. 2F is a cross sectional view showing the method for manufacturing a ferroelectric memory according to the embodiment, following FIG. 2E.

Next, as shown in FIG. 2F, an interlayer insulating film 14 is formed over the entire surface by a high density plasma method. A thickness of the interlayer insulating film 14 is set to be about 1.5 μm, for example.

Figure 2G:
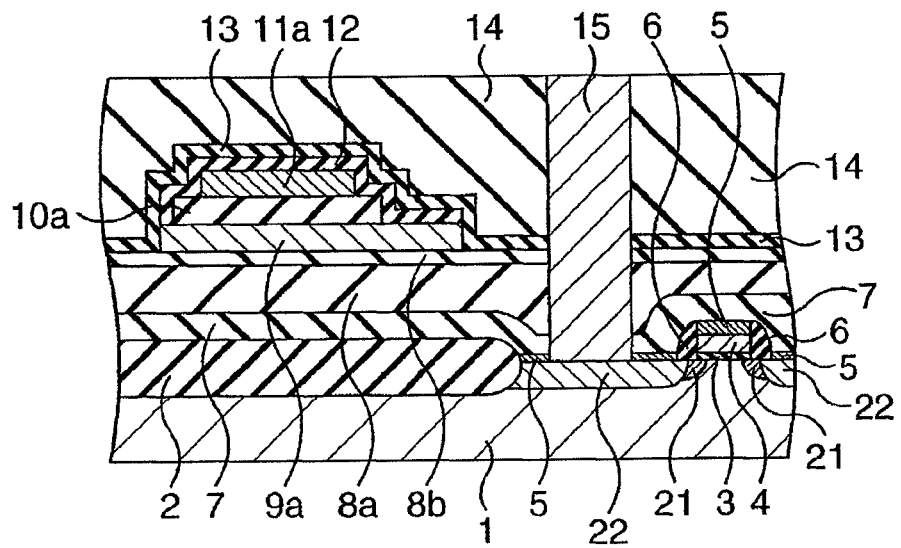
FIG. 2G is a cross sectional view showing the method for manufacturing a ferroelectric memory according to the embodiment, following FIG. 2F.

Then, as shown in FIG. 2G, flattening of the interlayer insulating film 14 is conducted by a Chemical Mechanical Polishing (CMP) method. Then, a plasma processing is conducted using an $N_2O$ gas. As a result, the surface of the interlayer insulating film 14 reacts somewhat into nitride, so that moisture penetration into the inside becomes less likely. It should be noted that the plasma processing is effective if a gas containing at least one of either nitrogen or oxygen is used. Then, a hole that reaches the silicide layer 5 on the high concentration diffusion layer 22 of the transistor is formed in the interlayer insulating film 14, the aluminum oxide ($Al_2O_3$) film 13, the silicon oxide film 8b, the silicon oxide film 8a and the silicon oxy-nitride film 7. Thereafter, a barrier metal film (not shown) is formed by forming a titanium (Ti) film and a titanium nitride (TiN) film in succession in the hole by a sputtering method. Subsequently, a tungsten (W) film is further embedded in the hole by a Chemical Vapor Deposition (CVD) method, and a tungsten (W) plug 15 is formed by flattening the tungsten (W) film by a CMP method.

Figure 2H:
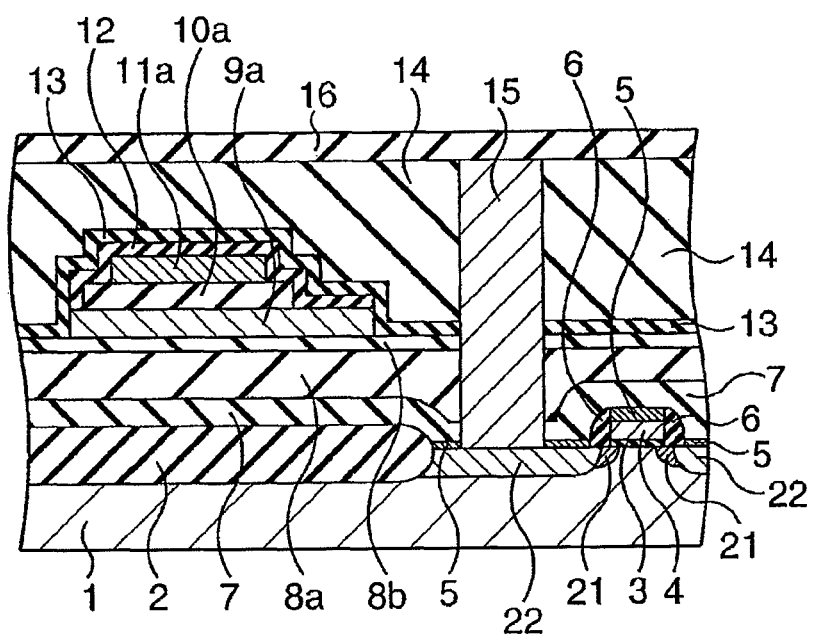
FIG. 2H is a cross sectional view showing the method for manufacturing a ferroelectric memory according to the embodiment, following FIG. 2G.

Thereafter, as shown in FIG. 2H, an SiON film 16 serving as an anti-oxidation film of the tungsten (W) plug 15 is formed, for example, by a plasma acceleration CVD method.

Figure 2I:
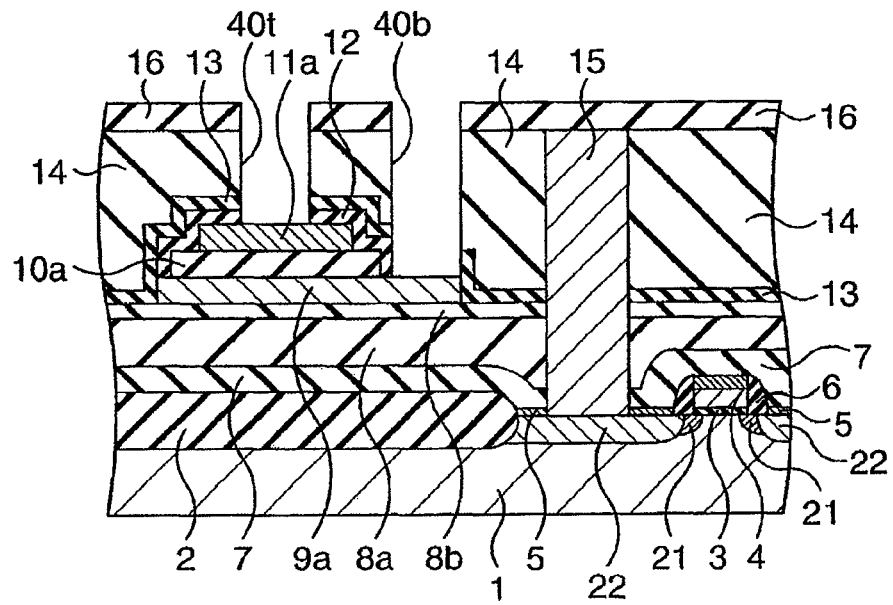
FIG. 2I is a cross sectional view showing the method for manufacturing a ferroelectric memory according to the embodiment, following FIG. 2H.

Next, as shown in FIG. 2I, a contact hole 40t that reaches the top electrode 11a and a contact hole 40b that reaches the bottom electrode 9a are formed in the silicon oxide nitride (SiON) film 16, the interlayer insulating film 14, the aluminum oxide ($Al_2O_3$) film 13, and the aluminum oxide ($Al_2O_3$) film 12. Thereafter, oxygen annealing is conducted to repair the damage.

Figure 2J:
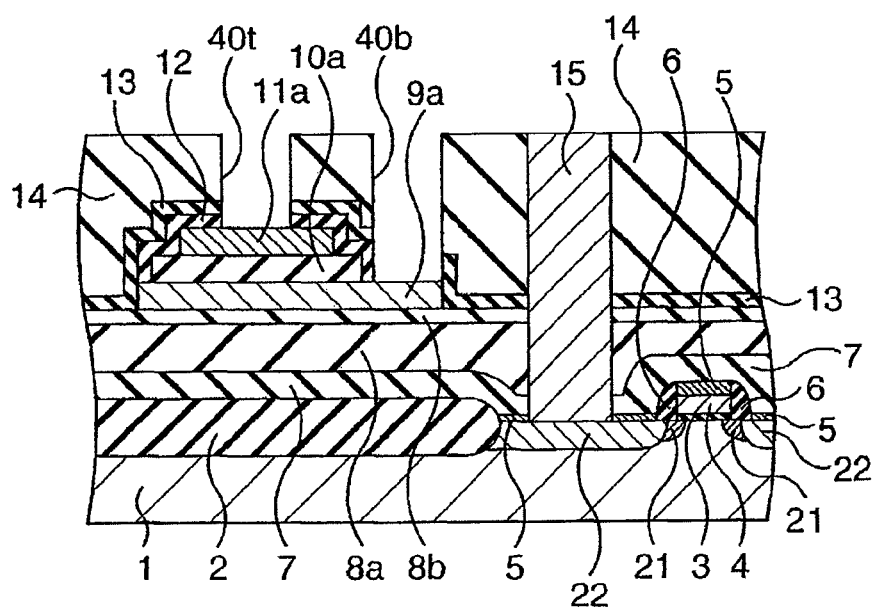
FIG. 2J is a cross sectional view showing the method for manufacturing a ferroelectric memory according to the embodiment, following FIG. 2I.
Figure 2K:
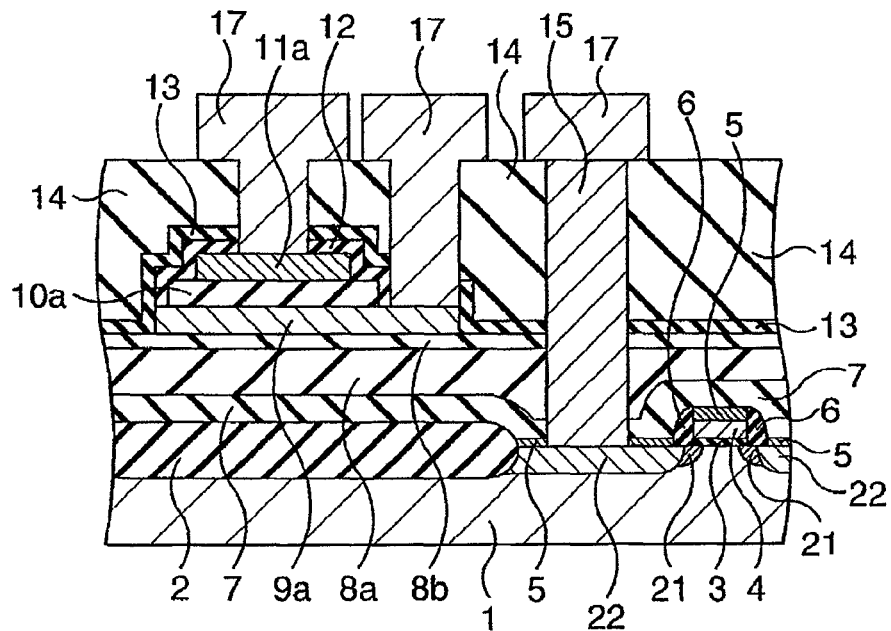
FIG. 2K is a cross sectional view showing the method for manufacturing a ferroelectric memory according to the embodiment, following FIG. 2J.

Next, as shown in FIG. 2J, the surface of the tungsten (W) plug 15 is exposed by removing the SiON film 16 over the entire surface by etch back. Subsequently, as shown in FIG. 2K, an aluminum (Al) film is formed in a state of exposing a portion of the surface of the top electrode 11a, a portion of the surface of the bottom electrode 9a, and the surface of the tungsten (W) plug 15, and by patterning the aluminum (Al) film, an aluminum (Al) wiring 17 is formed. At this time, for example, the tungsten (W) plug 15 and the top electrode 11a are connected to each other via a portion of the aluminum (Al) wiring 17.

Figure 2L:
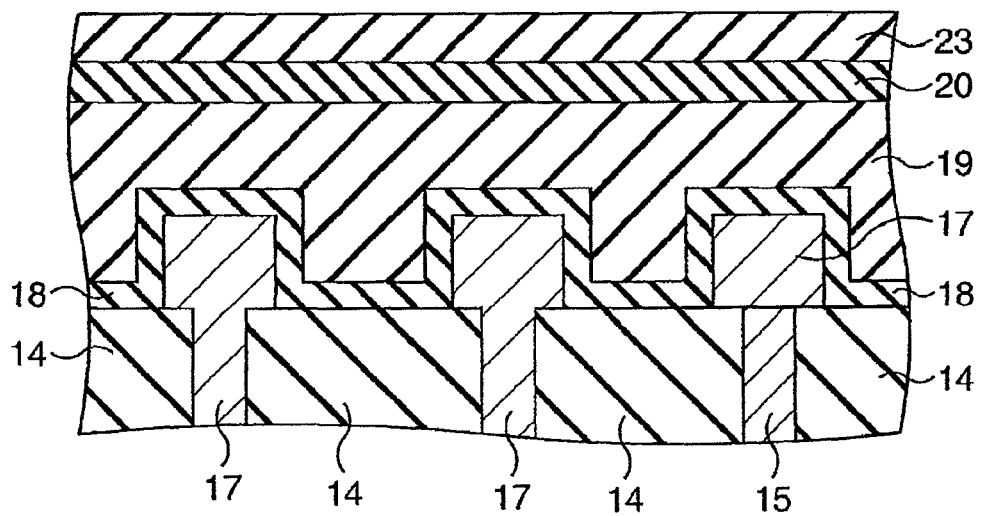
FIG. 2L is a cross sectional view showing the method for manufacturing a ferroelectric memory according to the embodiment, following FIG. 2K.

Thereafter, as shown in FIG. 2L, a silicon oxide film 18 covering the aluminum (Al) wiring 17 is formed by a sputtering method. As for the condition of the film formation, the RF power is set to 2 kW, the frequency is 13.56 MHz, the flow rates of argon (Ar) gas and oxygen ($O_2$) gas are 18 sccm, 2 sccm, respectively, the pressure inside chamber is 1 Pa. As a result, the silicon oxide film 18 grows at a speed of about 30 nm/min. A thickness of the silicon oxide film 18 is set to, for example, about 20 nm to about 100 nm. When the silicon oxide film 18 is formed under such a condition, no damage during the plasma processing occurs to the ferroelectric capacitor formed in advance. When a thickness of the silicon oxide film 18 is less than 20 nm, damage to the ferroelectric capacitor caused by later plasma processing is sometimes failed to be sufficiently suppressed. This effect is sufficient if a thickness of the silicon oxide film 18 is 100 nm, and if it exceeds this thickness, it arrives near the saturation state.

Subsequently, as shown similarly in FIG. 2L, a high density plasma oxide film 19 is formed over the entire surface and the surface thereof is flattened. An oxide film is may be formed by a plasma TEOS method or the like instead of the film 19. Next, an aluminum oxide ($Al_2O_3$) film 20 serving as a protective film is formed to prevent penetration of hydrogen and moisture on the high density plasma oxide film 19. A high density plasma oxide film 23 is further formed on the aluminum oxide ($Al_2O_3$) film 20.

Although an aluminum oxide film is not formed before forming the high density plasma oxide film 19 in the present embodiment, the silicon oxide film 18 is formed instead of the aluminum oxide film by the sputtering method. The silicon oxide film 18 has the function of suppressing possible plasma damage to the ferroelectric capacitor, which might occur at the time of forming the high density plasma oxide film 19 similarly to the aluminum oxide film usually formed.

Figure 2M:
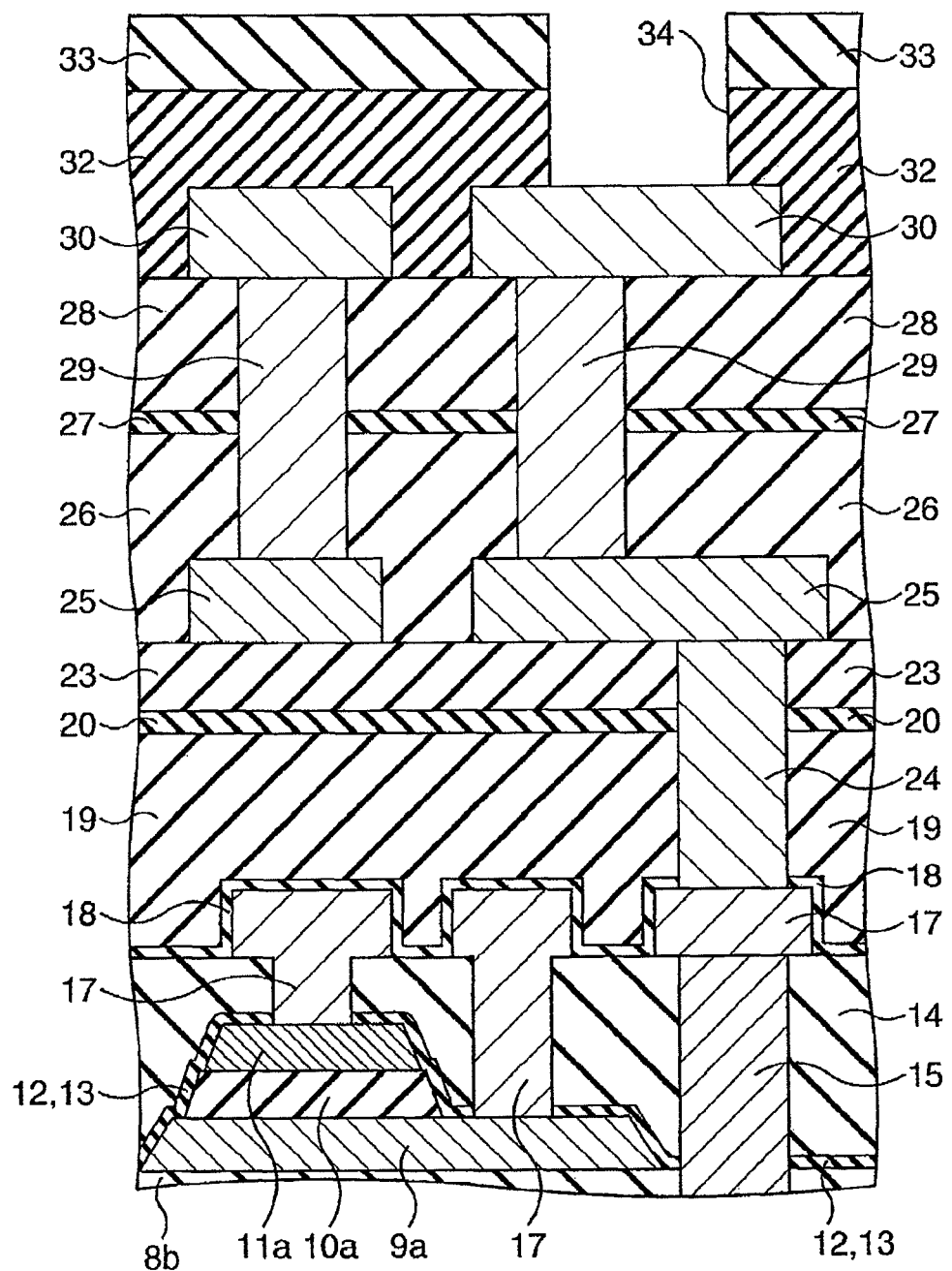
FIG. 2M is a cross sectional view showing the method for manufacturing a ferroelectric memory according to the embodiment, following FIG. 2L.

After forming the high density plasma oxide film 23, as shown in FIG. 2M, a via hole reaching the aluminum (Al) wiring 17 is formed in the high density plasma oxide film 23, the aluminum oxide ($Al_2O_3$) film 20, the high density plasma oxide film 19, and the silicon oxide film 18, and a tungsten plug 24 is embedded in the inside thereof.

In the present embodiment, the silicon oxide film 18 is formed as a film to suppress occurring of the plasma damage, and since processing of the silicon oxide film is easier than that of the aluminum oxide film, it is possible to form a via hole having a desired shape without difficulty. Accordingly, it is possible to avoid narrowing of the via hole and troubles caused by etching deposition products, which often happened previously.

After forming the tungsten plug 24, as is similarly shown in FIG. 2M, wiring 25, a high density plasma film 26, an aluminum oxide ($Al_2O_3$) film 27, a high density plasma film 28, a tungsten plug 29, an aluminum (Al) wiring 30, a TEOS oxide film 32, a pad silicon oxide film 33, and a pad opening 34 are formed. A portion of the aluminum (Al) wiring 30, which is exposed from the pad opening 34 is used as a pad.

In this way, the ferroelectric memory having the ferroelectric capacitor is completed.

Thus, according to the embodiment, since the silicon oxide film 18, which suppresses occurrence of the plasma damage, is formed, the plasma damage would not occur to the ferroelectric capacitor even at the time of forming the high density plasma oxide film 19, which is formed later. In addition, since the silicon oxide film 18 can be processed easier than the aluminum oxide film, it is possible to easily form a contact hole as would be expected by its design. Regarding the suppression of hydrogen and moisture penetration from outside, since the silicon oxide film 18 formed by the sputtering method is not rather dense and its hygroscopicity is high, the penetration of moisture can be suppressed. In addition, a plurality of aluminum oxide ($Al_2O_3$) films is formed above or below the silicon oxide film 18. Accordingly, no problem occurs in particular. It is thought that the mechanism in which a ferroelectric capacitor is damaged with a plasma in a prior art is (1) moisture and hydrogen generates with the plasma, (2) the moisture gets dissociated to hydrogen, and (3) the hydrogen in (1) and (2) reaches the ferroelectric capacitor with a bias voltage to the substrate. With the silicon oxide film 18, generation of hydrogen at the surface of the Al wiring 30 can be suppressed. Moreover, the silicon oxide film 18 does not tend to generate moisture and hydrogen when the film itself is formed.

It should be noted that an insulating film covering the aluminum (Al) wiring 17 is not limited to the above-described silicon oxide film 18, so far as the degree of damage to the ferroelectric capacitor when the insulating film is formed is equal to or lower than the degree when the aluminum oxide film is formed. For example, a CVD oxide film having a thickness of 20 nm or more may be formed under reduced or normal pressure. The CVD oxide film has a merit that the growth rate is faster than that of the aluminum oxide film and the throughput can be improved. When the film is formed by a reduced-pressure CVD method, the ambient temperature is preferably 600° C. When the ambient temperature is set higher than 600° C., the aluminum (Al) wiring 17 could possibly be melted, or the characteristics of the ferroelectric capacitor could be damaged. When the film is formed by a normal pressure CVD method, it is preferable to set the ambient temperature between 300° C. and 600° C., and more favorably, between 300° C. and 500° C., because when the ambient temperature is out of this temperature range, the characteristics of the ferroelectric capacitor could be damaged, or a sufficiently fast deposition could be difficult to obtain. In other words, since the melting point of aluminum (Al) is about 660° C., if the ambient temperature is between 300° C. and 600° C., it is possible to form a CVD oxide film. The ambient temperature of 450° C. or below is especially preferable. In these methods, the bias voltage to the substrate is zero or low; therefore, the hydrogen can hardly reach the ferroelectric capacitor.

It is also possible to form an ozone TEOS oxide film having a thickness of 20 nm or more using TEOS as a raw material and ozone as an oxidant. Since the ozone TEOS oxide film is not so dense, and high in hygroscopicity, it is possible to reduce the penetration of moisture. Note that when the ozone TEOS oxide film is formed, it is preferable to set the ambient temperature to be between 400° C. and 600° C. If the ambient temperature is adopted to be 600° C. or higher, the aluminum (Al) wiring 17 could melt or the characteristics of the ferroelectric capacitor could be deteriorated.

It is also possible to form a plasma CVD oxide film without applying bias on a substrate by a two frequency unbiased plasma CVD method. As for the condition for this case, for example, the source RF power is set to 3 kW, the flow rates of silicon hydride ($SiH_4$) gas, ozone ($O_2$) gas, and argon (Ar) gas are set to be 70 sccm, 525 sccm and 420 sccm, respectively, and the temperature is set to be 300° C. As a result, the plasma CVD oxide film grows at a speed of about 530 nm/minute. The thickness of the plasma CVD oxide film is set to be 20 nm or more, for example. The oxide film formed by such a method can prevent the penetration of moisture. In addition, since bias is not applied to the substrate, plasma damage can also be reduced.

It is also acceptable to form a coating type oxide film such as SOG (Spin On Glass) film or the like having a thickness of 20 nm or more. In this case, annealing treatment is conducted, after applying a raw material for SOG by a spin coating method, for example. As the raw material for SOG, for example, polysilazane, hydrogen silsesquioxan for low hygroscopicity ratio SOG, fluorine-containing hydrogen silsesquioxan, and silica series porous materials and the like can be cited. Since the hygroscopicity of the coating type oxide film is also high, it is possible to restrain the penetration of moisture.

It is also possible to form a polyimide film. In this case, for example, after polyimide material is applied at a thickness of 1200 nm by spin coating, it is cured by a thermal treatment, and then etched back by asking. At the thermal treatment, it is conducted at a temperature of 310° C., a flow rate of nitrogen ($N_2$) gas at 100 slm, and a treatment time for 40 minutes. At the time of conducting etch back, the amount corresponding to a thickness of 500 nm is removed, so that the amount corresponding to a thickness of 700 nm is still remaining. The polyimide film can restrain the penetration of moisture.

It is also possible to form an oxide film by oxidizing a surface of aluminum (Al) wiring 17 with an oxygen radical, oxygen plasma or the like. In this case, for example, the frequency of the source microwave is set to be 2.45 GHz, the output is 1400 W, the pressure inside the chamber is 133.3 Pa (1 Torr), the flow rates of oxygen ($O_2$) gas and nitrogen ($N_2$) gas are 1350 sccm and 150 sccm respectively, the temperature is 200° C., the treatment time is 70 seconds. For example, when treatment is conducted by oxygen radical using, for example, a down flow type asher or the like, plasma damage does not occur at the time of the treatment. In addition, when it is treated by oxygen plasma while the bias voltage applied on a substrate is controlled using a two frequency type plasma apparatus or the like, the plasma damage would not occur during the treatment. As a result of the treatment described above, the composition of the surface of the aluminum (Al) wiring 17 becomes close to that of alumina, so that penetration of moisture can be restrained. It should be noted that when the surface of the aluminum wiring 17 is oxidized by these method, a via hole is more likely to be formed in a later process, compared with the case of accumulation of an aluminum oxide film.

It is also adoptable if an oxide film containing impurities is formed. As such an oxide film, for example, Phospho-Silicate Glass (PSG) film, Boro-Phospho-Silicate Glass (BPSG) film, Fluoro-Silicate Glass (FSG) film or the like can be cited. In this case, for example, it is recommendable to conduct sputtering deposition using a sputtering target containing impurities such as phosphorus, boron, fluorine, or the like. It is also possible to form an oxide film by an atmospheric pressure CVD method or a low pressure CVD method using a source gas containing impurities such as phosphorus, boron, fluorine, or the like. As a source gas, for example, $PH_3$, $B_2H_6$, $PO(OCH_3)_3$, $B(OCH_3)_3$, $SiF_4$, $CF_4$, and so on can be cited. It is preferable to adjust the phosphorus (P) concentration in the film to between 0 and about 7 wt %, and the boron (B)

concentration to between 0 and about 7 wt %. As an example of conditions for forming an FSG film, the power of source RF is set to be 3.5 kW, the frequency is set to 400 kHz, the flow rates of $SiF_4$ gas, $SiH_4$ gas, $O_2$ gas and Ar gas are set to 75 sccm, 8 sccm, 175 sccm and 90 sccm, respectively, and the temperature is 420° C. As a result, the oxide film grows at a speed of about 470 nm/min., and fluorine (F) concentration in the film will be about 11 atm %. The refractive index is about 1.42. Note that when the FSG film is formed, it is preferable to perform deposition using a two frequency wave type plasma apparatus without applying bias on a substrate.

The hygroscopicity of an oxide film containing such an impurity is higher than that of an oxide film without containing such an impurity. Accordingly, it can further prevent the penetration of moisture.

Figure 3:
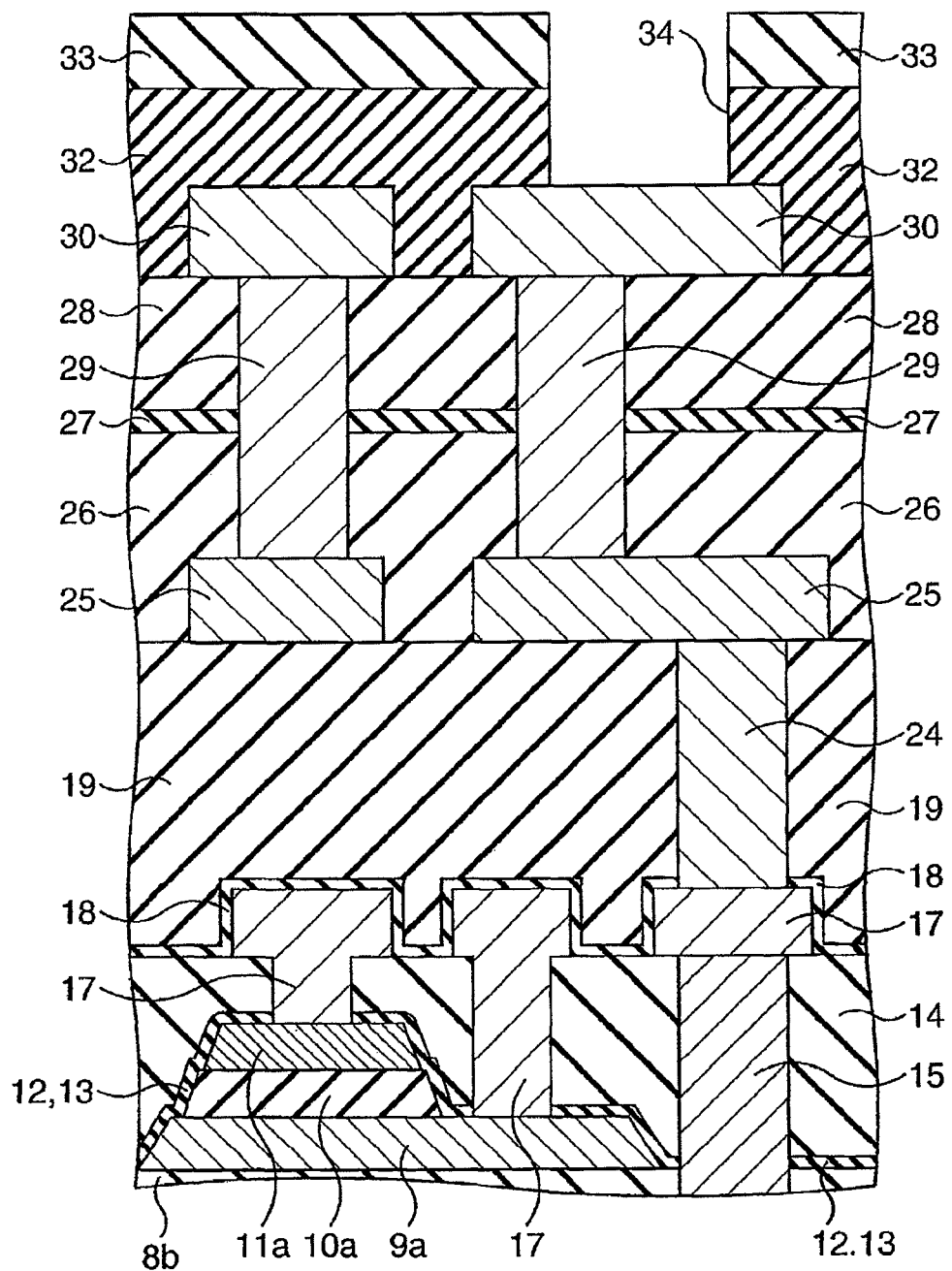
FIG. 3 is a cross sectional view showing another embodiment of the ferroelectric memory.

It should be noted that though the aluminum oxide ($Al_2O_3$) film 20 is formed between the high density plasma oxide film 19 and the high density plasma oxide film 23 in the above-described embodiment, it is also acceptable to form the high density plasma oxide film 19 thickly, instead of forming the aluminum oxide ($Al_2O_3$) film 20 and the high density plasma oxide film 23 as shown in FIG. 3.

After forming the silicon oxide film 18, it is preferable to conduct nitrogen gas ($N_2$) annealing or the like, or to conduct a thermal treatment in a plasma atmosphere generated by using nitrogen gas or the like. As a result of these treatments, the silicon oxide film 18 is reformed by dehydrating and nitriding of the surface and the like so that the hygroscopicity is much more improved.

In addition, as a ferroelectric film, it is also possible to use a perovskite structure compound film such as a PZT ($PbZr_{1-x}Ti_xO_3$) film, a film added very small quantity of lanthanum (La), calcium (Ca), strontium (Sr), silicon (Si) or the like to a PZT film, or a bismuth (Bi) layer series structure compound film such as a $SrBi_2Ta_xNb_{1-x}O_9$ film, a $Bi_4Ti_2O_{12}$ films or the like. Furthermore, there is no particular limitation for the forming method of a ferroelectric film and the ferroelectric film can be formed by a sol-gel method, a sputtering method, an MOCVD method and so on.

Patent Document 6 describes formation of a sputtering oxide film on a wiring by applying high frequency bias for the purpose of improving coverage of an interlayer insulating film. When this method is applied to a ferroelectric memory, however, great damage occurs to a ferroelectric capacitor at the time of forming the sputtering oxide film associated with application of high frequency bias.

Patent Document 7 describes formation of various passivation films for the purpose of preventing occurrence of a crack in the wiring and the passivation film. However, since it forms a plurality of films, it is troublesome in the process. Besides it is difficult to suppress the plasma damage sufficiently.

Patent Document 8 describes formation of a sputtering oxide film after cutting down corners of the aluminum (Al) wiring for the purpose of improving coverage. When this method is applied to the ferroelectric memory, however, damage occurs to the ferroelectric capacitor at the time of forming the sputtering oxide film.

INDUSTRIAL APPLICABILITY

As described above in detail, according to the embodiment, it is possible to easily form a via hole reaching the wiring. Accordingly, it is possible to resolve inconvenience when the via hole is formed, and to obtain desired characteristics in stable fashion so that the yield is improved.

What is claimed is:

1. A method for manufacturing a semiconductor device, comprising:
   forming a ferroelectric capacitor provided with a ferroelectric film above a semiconductor substrate;
   forming a wiring on and directly connected to an electrode of the ferroelectric capacitor;
   forming a silicon oxide film with a thickness of between 20 nm and 100 nm covering at least an upper surface of the wiring by sputtering method; and
   forming a first plasma oxide film over the silicon oxide film by plasma CVD method, a lower surface of the first plasma oxide film being in contact with an upper surface of the silicon oxide film;
   wherein the method further comprises forming an aluminum oxide film over and in contact with the first plasma oxide film.

2. The method for manufacturing a semiconductor device according to claim 1, wherein a film containing at least one kind of impurities selected from the group consisting of phosphorous and boron is formed as the silicon oxide film.

3. The method for manufacturing a semiconductor device according to claim 1, wherein:
   the ferroelectric capacitor includes a lower electrode, the ferroelectric film on the lower electrode and an upper electrode on the ferroelectric film;
   the wiring is a first wiring, the electrode is the lower electrode, wherein the device further includes a second wiring which is connected to the upper electrode; and
   a part of the plasma oxide film is located between the first wiring and the second wiring.

4. A method for manufacturing a semiconductor device, comprising:
   forming a ferroelectric capacitor provided with a ferroelectric film above a semiconductor substrate;
   forming a wiring on and directly connected to an electrode of the ferroelectric capacitor;
   forming a silicon oxide film with a thickness of between 20 nm and 100 nm covering at least an upper surface of the wiring by sputtering method; and
   forming a first plasma oxide film over the silicon oxide film by plasma CVD method, a lower surface of the first plasma oxide film being in contact with an upper surface of the silicon oxide film;
   further comprising performing nitrogen gas ($N_2$) annealing to said silicon oxide film.

* * * * *